(12) United States Patent
Lang et al.

(10) Patent No.: US 10,726,925 B2
(45) Date of Patent: Jul. 28, 2020

(54) MANAGE SOURCE LINE BIAS TO ACCOUNT FOR NON-UNIFORM RESISTANCE OF MEMORY CELL SOURCE LINES

(71) Applicant: SANDISK TECHNOLOGIES LLC, Addison, TX (US)

(72) Inventors: Murong Lang, Santa Clara, CA (US); Zhenming Zhou, San Jose, CA (US); Deepanshu Dutta, Fremont, CA (US)

(73) Assignee: SANDISK TECHNOLOGIES LLC, San Jose, CA (US)

( * ) Notice: Subject to any disclaimer, the term of this patent is extended or adjusted under 35 U.S.C. 154(b) by 34 days.

(21) Appl. No.: 16/142,386

(22) Filed: Sep. 26, 2018

(65) Prior Publication Data

US 2020/0098434 A1    Mar. 26, 2020

(51) Int. Cl.

| | | |
|---|---|---|
| G11C 11/34 | (2006.01) | |
| G11C 16/26 | (2006.01) | |
| G11C 16/04 | (2006.01) | |
| G11C 16/24 | (2006.01) | |
| H01L 27/11524 | (2017.01) | |
| H01L 27/11565 | (2017.01) | |
| H01L 27/11556 | (2017.01) | |
| H01L 27/11582 | (2017.01) | |
| H01L 27/11519 | (2017.01) | |
| H01L 27/1157 | (2017.01) | |

(52) U.S. Cl.
CPC .......... *G11C 16/26* (2013.01); *G11C 16/0483* (2013.01); *G11C 16/24* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
CPC .................................................. G11C 16/0483
USPC ..................................................... 365/185.17
See application file for complete search history.

(56) References Cited

U.S. PATENT DOCUMENTS

| | | | | |
|---|---|---|---|---|
| 9,047,954 B2* | 6/2015 | Kamei | ............... | G11C 16/0483 |
| 2016/0086675 A1* | 3/2016 | Ray | ......... | G11C 16/26 |
| | | | | 365/185.12 |
| 2018/0247695 A1* | 8/2018 | Kasai | ................. | G11C 16/3459 |
| 2018/0286488 A1* | 10/2018 | Sanasi | ................ | G11C 11/5642 |

* cited by examiner

*Primary Examiner* — Huan Hoang
*Assistant Examiner* — Minh Dinh
(74) *Attorney, Agent, or Firm* — Vierra Magen Marcus LLP

(57) ABSTRACT

Methods and systems for improving the reliability of data stored within a semiconductor memory are described. One issue with determining stored data states for memory cells within a NAND-type memory is that the voltage at the source end of a NAND string may vary greatly from when a memory cell of the NAND string is program verified to when the memory cell is subsequently read leading to bit errors. To compensate for this variability in the source line voltage, different sensing conditions (e.g., the bit line voltages and/or the sensing times) may be applied during a read operation to different sets of memory cells depending on the source line resistance from the memory cells or on the source line voltage zone assigned to the memory cells.

25 Claims, 14 Drawing Sheets

(Prior Art)

MANAGE SOURCE LINE BIAS TO ACCOUNT FOR NON-UNIFORM RESISTANCE OF MEMORY CELL SOURCE LINES

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Flash memory may utilize floating-gate transistors or charge-trap transistors. In the case of floating gate transistors, for each floating-gate transistor, a floating gate is positioned adjacent to and insulated from a channel region of the floating-gate transistor. The channel region is positioned between source and drain regions of the floating-gate transistor. A control gate is positioned adjacent to and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (e.g., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. NAND strings may be oriented such that the strings are orthogonal to a substrate of a memory die (e.g., 3D vertical NAND strings). In recent years, NAND flash memory has been scaled in order to reduce cost per bit. However, as process geometries shrink, many design and process challenges are presented. These challenges include increased variability in memory cell IV (current and voltage) characteristics and increased variability in source line resistances.

DETAILED DESCRIPTION

Figure 1:
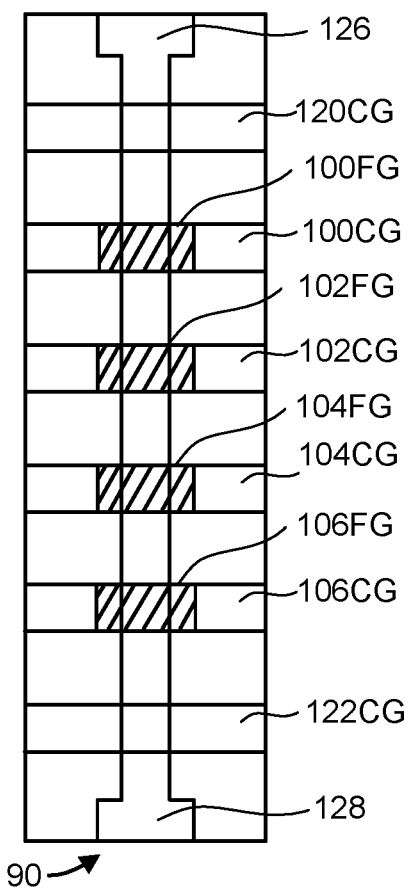
FIG. 1 depicts one embodiment of a NAND string.

Technology is described for improving the reliability of data stored within a semiconductor memory (e.g., a NAND-type flash memory). One issue with determining stored data states for memory cells within a NAND-type memory is that the voltage at the source end of a NAND string may vary greatly from when a memory cell of the NAND string is program verified to its programmed data state (e.g., it may be that only the one NAND string is conducting current when the memory cell is verified) to when the memory cell is subsequently read (e.g., many NAND strings may be conducting when the memory cell is read causing current from the many NAND strings to flow through a common source line connected to the many NAND strings) leading to bit errors. Both a program verify operation and a read operation are types of sensing operations. However, because of a difference in the number of memory cells involved in each operation, the voltage of the source line can vary during each operation. The variability in the source line voltage at the source end of the NAND string between program verify operations and subsequent read operations may be more pronounced for memory cells with higher programmed data states or higher programmed threshold voltages (VTs) because the lower state memory cells may have been locked-out earlier during a program verify operation. Memory cells that are locked-out are memory cells that are removed from subsequent program loops (application of a program pulse and a subsequent program verify operation).

To compensate for this variability in the source line voltage, different sensing conditions (e.g., the bit line voltages and/or the sensing times) may be applied during a read operation to different sets of memory cells depending on the source line resistance from the memory cells to a source line driver or to a common point on a source line wire or grid. In one example, the different sensing conditions may be applied based on bit line physical location and/or memory hole location corresponding with a particular NAND string as the source line resistance may depend on the physical location of the memory cells. In another example, the different sensing conditions may be applied based on whether memory cells are part of an inner memory hole string or an outer memory hole string. In another example, the different sensing conditions may be applied based on the physical location of a vertical NAND string between vertical shunts (e.g., memory cells located within a middle zone farthest from two vertical shunts may have a larger source line resistance compared with memory cells located closer to the shunts).

In some embodiments, a plurality of source line voltage zones may be determined or identified (e.g., using a table look-up based on bit line and/or word line addresses) and memory cells may be assigned to a zone of the plurality of source line voltage zones based on the source line resistance from the memory cells. In one example, a first memory cell may be assigned to a first zone of the plurality of source line voltage zones if the source line resistance from the first memory cell is between a first resistance and a second resistance or if the distance from a vertical shunt corresponding with a source line grid is between a first distance and a second distance (e.g., the first memory cell is located between 10 um and 20 um from the vertical shunt); a second memory cell may be assigned to a second zone of the plurality of source line voltage zones if the source line resistance from the second memory cell is greater than the second resistance or if the distance from the vertical shunt corresponding with the source line grid is greater than the second distance (e.g., 20 um or 40 um).

In some embodiments, a plurality of source line voltage zones may be determined or identified (e.g., using a table look-up based on bit line and/or word line addresses) and a NAND string may be assigned to a zone of the plurality of source line voltage zones based on the source line resistance from the source-side end of the NAND string to a point on the source line grid. In one example, a first NAND string may be assigned to a first zone of the plurality of source line voltage zones if the source line resistance from the first NAND string to the point on the source line grid is between a first resistance and a second resistance or if the distance from a vertical shunt corresponding with the point on the source line grid is between a first distance and a second distance (e.g., the first NAND string is located between 30 um and 50 um from the vertical shunt).

In certain embodiments, a plurality of source line voltage zones may be determined when a memory array of NAND strings is manufactured and tested. The memory array may be configured to use a predefined set of source line voltage zones.

The sensing conditions applied to a NAND string to read a memory cell within the NAND string may comprise the amount of bit line voltage applied to a bit line connected to a drain-side end of the NAND string, the amount of source line voltage applied to a source line connected to a source-side end of the NAND string, the amount of word line voltage applied to a word line connected to the memory cell, the amount of time during which current flows through the memory cell, the amount of sensing time during which a capacitor connected to the bit line is allowed to discharge, the amount of additional current injected into the bit line during sensing of the memory cell, and the like.

The sensing conditions applied to a memory cell within a memory array or within a NAND string may refer to the word line, bit line, and/or source line biasing conditions used during sensing of the memory cell, and/or the amount of sensing time used for sensing the memory cell.

As an example, the sensing conditions applied to memory cells within different source line voltage zones during a read operation may include adjusting the bit line voltages such that memory cells of middle zone strings have a higher bit line voltage (e.g., 400 mV) compared with side zone strings closer to the vertical shunts that have a lower voltage applied (e.g., 200 mV). The sensing conditions applied to memory cells of the different source line voltage zones during the read operation may also include adjusting the sensing current such that memory cells of middle zone strings have a reduced current to overcome (e.g., 200 nA) compared with memory cells in the side zone strings (e.g., 500 nA). Moreover, the sensing conditions applied to memory cells of the different source line voltage zones during the read operation may include adjusting the sensing time such that memory cells of middle zone strings have a longer sensing time (e.g., 400 ns) compared with memory cells in the side zone strings (e.g., 200 ns).

A sensing pass may be performed during a read operation (e.g., to determine the stored data state of a memory cell) or during a program verify operation (e.g., to determine whether a memory cell has been programmed to the desired data state). During the sensing pass, a set of sense amplifiers or sensing circuitry may be connected to a set of memory cells being sensed. The sense amplifiers may allow bit lines connected to the memory cells to discharge at a rate dependent on the amount of current discharging through the memory cells or memory cell transistors connected to the bit lines for a sensing time (e.g., 1.1 us or 2.24 us). After the sensing time has occurred, the changes in voltages due to the amount of discharge per bit line may be sampled and/or compared to determine whether the memory cells have threshold voltages greater than a reference voltage (e.g., whether a particular memory cell transistor has a threshold voltage greater than 3V). A longer sensing time may provide memory cells a longer time to discharge an integration capacitor within the sense amplifier and/or bit line capacitance connected to the sense amplifier.

In some embodiments, as the variability in source line IR drop may be data dependent, the number of source line voltage zones (or source line resistance zones) may be adjusted or set (e.g., on a per page basis) based on a fail bit count or a bit error count for the data stored within a page. In one example, if a page of data is read and is determined to have more than a threshold number of bit errors (e.g., more than two bit errors), then the number of source line voltage zones may be increased (e.g., from one to three). The number of source line voltage zones per page and the corresponding bit line ranges for the zones may be written to an extended section or a sideband section of the page for storing page related information. The number of source line voltage zones may be increased until the bit error count fails below a threshold number of bit errors (e.g., is less than two bit errors).

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 2:
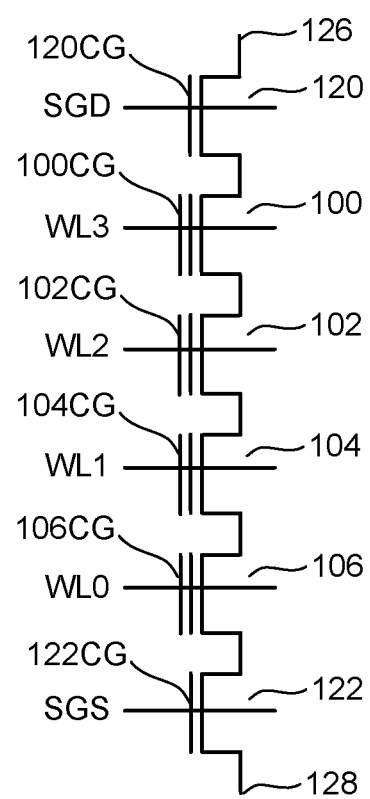
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

One architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

No particular non-volatile memory technology is required for purposes of the new embodiments proposed herein. Other examples of suitable technologies for memory cells include ReRAM memory, magnetoresistive memory (e.g., MRAM), phase change memory (e.g., PCM), and the like. One example of a ReRAM or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper) with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. Phase change memory (PCM) may exploit the unique behavior of chalcogenide glass.

A person of ordinary skill in the art will recognize that the technology described herein is not limited to a single specific memory structure, but covers many relevant memory structures within the spirit and scope of the technology as described herein and as understood by one of ordinary skill in the art.

Figure 3A:
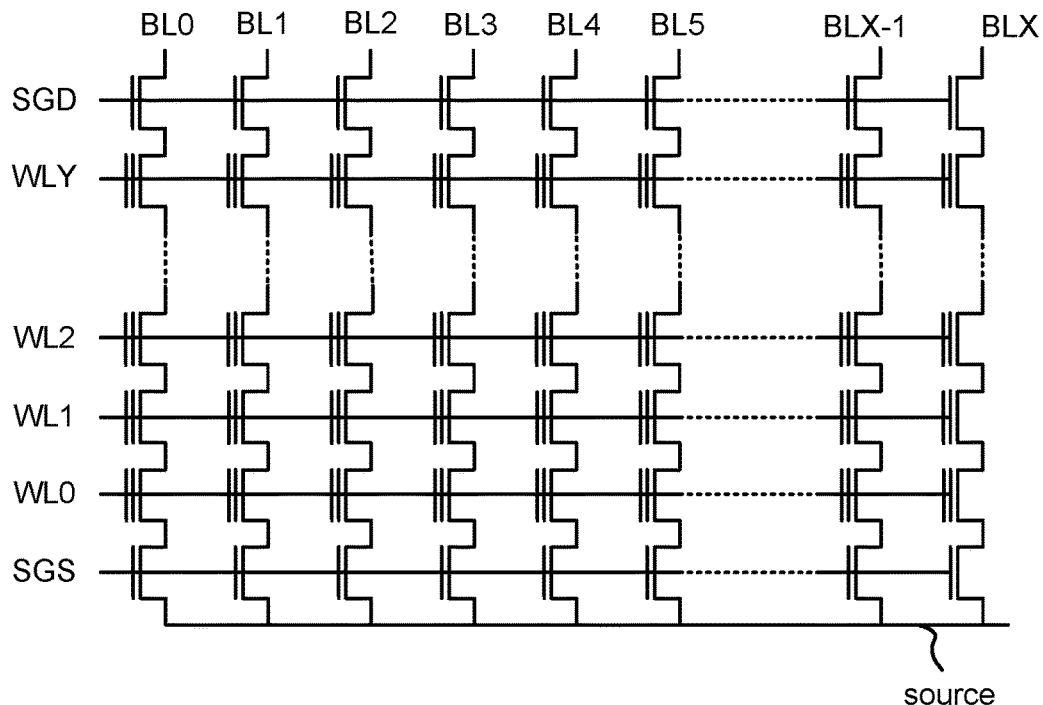
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) requires more area on the die. Therefore, from an integrated circuit area standpoint, it may be beneficial to only use one drain-side selection gate for each NAND string and then connect each NAND string of the pair with only one of the two drain-side selection signals.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor (e.g., an integration capacitor) in a sense amplifier. In another example, the conduction current of the selected memory cell allows (or fails to allow) the NAND string that included the memory cell to discharge a voltage on the corresponding bit line. The voltage of the bit line may be measured after a period of time (e.g., after a sensing time during which the bit line has been discharged) to determine whether the bit line has been discharged by a particular amount or not.

Figure 3B:
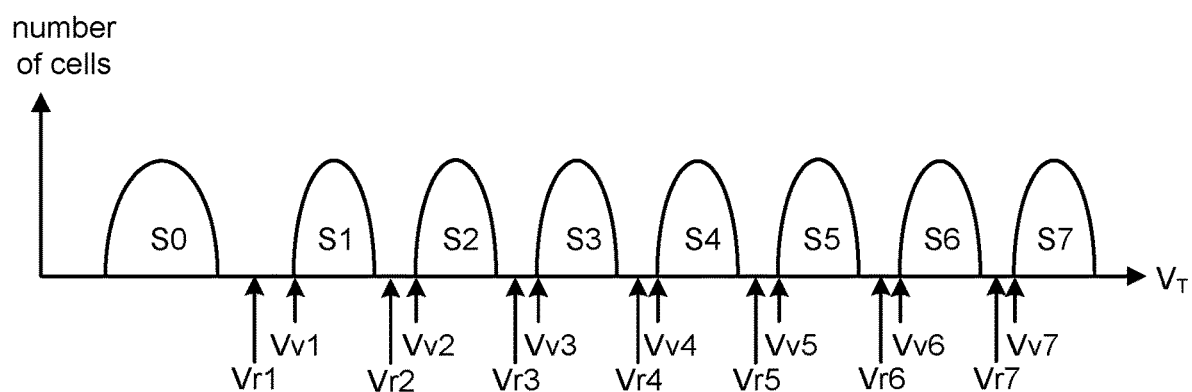
FIG. 3B depicts one embodiment of possible threshold voltage distributions (or data states) for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 3C:
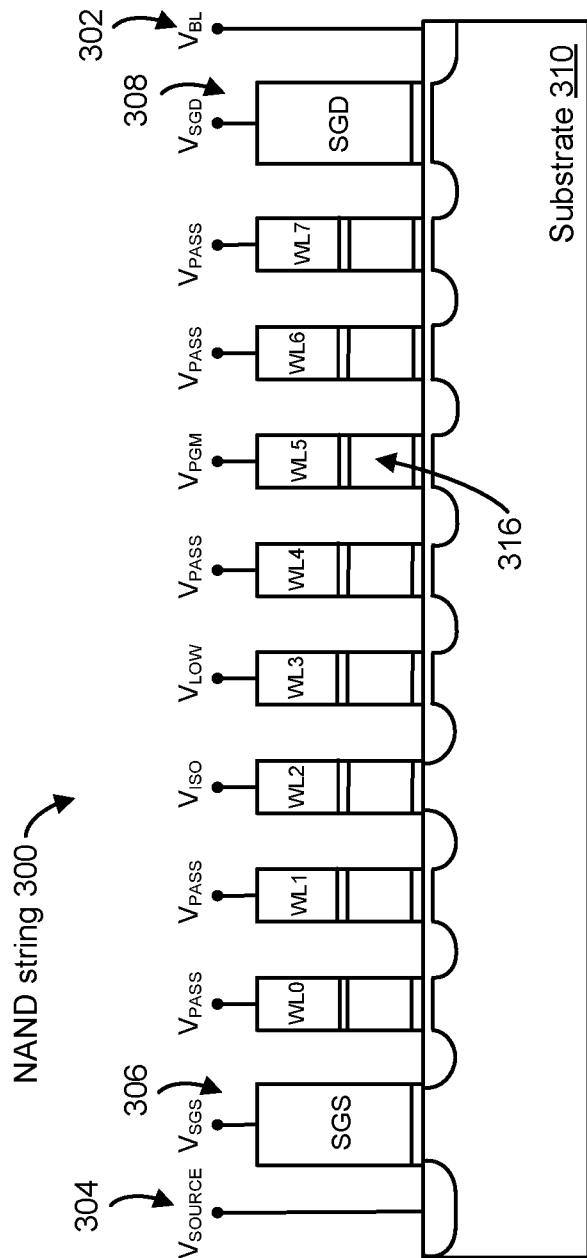
FIG. 3C depicts one embodiment of a NAND string during a programming operation.

FIG. 3C depicts one embodiment of a NAND string 300 during a programming operation. When programming a storage element (e.g., the storage element 316 associated with WL5) of the NAND string 300, a programming voltage may be applied to the selected word line associated with the storage element and a low voltage (e.g., ground) may be applied to the bit line associated with the storage element. As depicted, the NAND string 300 includes a source-side select gate 306, a drain-side select gate 308, and eight word lines WL0-WL7 formed above a substrate 310. $V_{SGS}$ may be applied to the source-side select gate 306 and $V_{SGD}$ may be applied to the drain-side select gate 308. The bit line 302 may be biased to VBA and the source line 304 may be biased to $V_{SOURCE}$. During a programming operation, a programming voltage, $V_{PGM}$, may be applied to selected word line WL5, which is associated with a selected storage element 316.

In one example of a boosting mode, when storage element 316 is the selected storage element, a relatively low voltage, $V_{LOW}$ (e.g., 2-6V) may be applied to a source-side word line (WL3), while an isolation voltage, $V_{ISO}$ (e.g., 0-4V) may be applied to another source-side word line (WL2), referred to as an isolation word line and a pass voltage, $V_{PASS}$, may be applied to the remaining word lines associated with NAND string 300 (in this case word lines WL0, WL1, WL4, WL6, and WL7). While the absolute values of $V_{ISO}$ and $V_{LOW}$ may vary over a relatively large and partly overlapping range, $V_{ISO}$ may be less than $V_{LOW}$. In some cases, $V_{ISO}$ may be less than $V_{LOW}$ which is less than $V_{PASS}$ which is less than $V_{PGM}$.

Figure 3D:
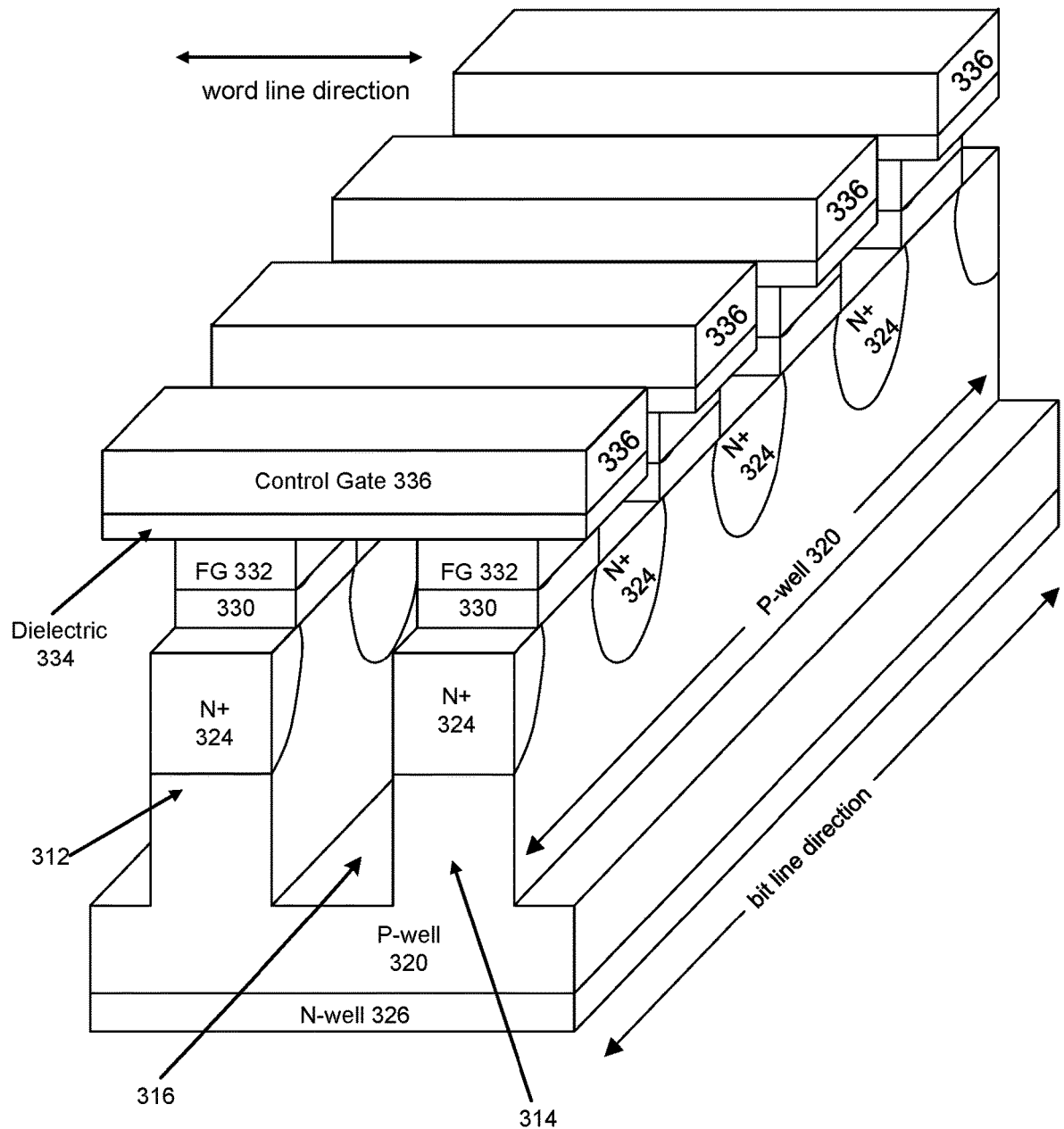
FIG. 3D depicts one embodiment of two NAND strings that may be fabricated as part of a larger flash memory array.

FIG. 3D depicts one embodiment of two NAND strings 312 and 314 that may be fabricated as part of a larger flash memory array. As depicted, NAND strings 312 and 314 each include four memory cells, n-type diffusions 324, and a portion of a shared P-well 320. Each memory cell in a NAND string corresponds with a floating gate 332 isolated by dielectric layers 334 and 330. N-well 326 is below P-well 320. The bit line direction (or y-direction) runs in the direction of the NAND strings, and the word line direction (or x-direction) runs perpendicular to the NAND strings or the bit line direction. The word line direction may be referred to as the row direction and the bit line direction may be referred to as the column direction. In some cases, a bit line associated with a NAND string may run in the bit line direction on top of (or over) the NAND string in a direction perpendicular to the word line direction. In some cases, the N-well 326 may sit in a P-type substrate (not depicted). As depicted, NAND string 312 is separated from NAND string 314 by an isolation region 316. The isolation region 316 may include an insulating material or dielectric between adjacent NAND strings (not depicted). Typically, shallow trench isolation (STI) is used to isolate adjacent NAND strings (e.g., using an active area STI). In one embodiment, the control gates 336 correspond with word lines, such as word lines WL0-WLY of FIG. 3A.

Figure 4A:
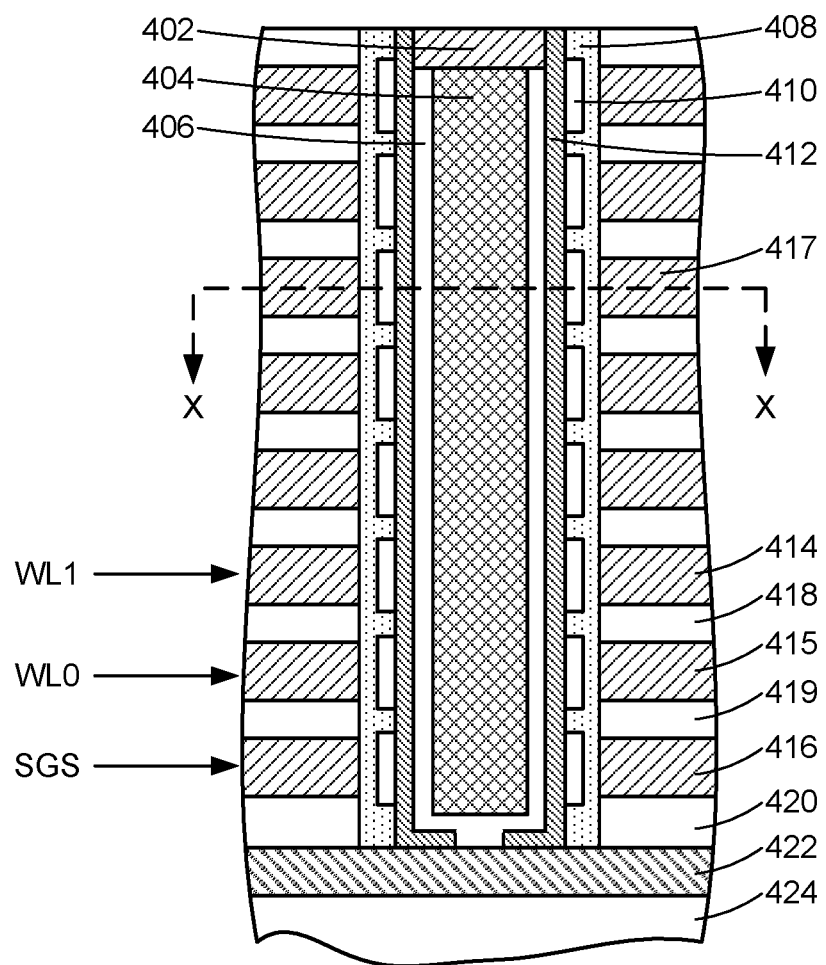
FIG. 4A depicts one embodiment of a vertical NAND structure.

FIG. 4A depicts one embodiment of a vertical NAND structure. The vertical NAND structure includes a vertical NAND string formed above the substrate 424 and oriented such that the vertical NAND string is orthogonal to the substrate 424. The vertical NAND string may be arranged within a vertical memory hole that is etched through alternating layers of control gate material (e.g., tungsten or polysilicon) and inter-gate insulator material (e.g., oxide or silicon oxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon or an N-well layer) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a dielectric material 408 (e.g., oxide or a stack of dielectric layers, such as layers of $Al_2O_3$ and $SiO_2$), a floating gate material 410 (e.g., polysilicon), a tunneling layer material 412 (e.g., a thin oxide), and a channel layer material 406 (e.g., undoped polysilicon) may be deposited within the memory hole and arranged in order to form the vertical NAND string. The tunneling layer material 412 may comprise a portion of a multi-layer dielectric stack such as an ONO dielectric stack, which includes alternating layers of silicon dioxide ("O") and silicon nitride ("N"). In some cases, a core material layer 404 (e.g., oxide) may be formed within the memory hole. In other cases, the core material layer 404 may be omitted. A bit line contact layer 402 may be formed at the top of the memory hole and connect to the channel layer material 406. The channel layer material 406 may connect to the source line layer 422 at the bottom of the memory hole. Thus, in this case, the bit line contact layer 402 connects to the vertical NAND string at the top of the memory hole and the source line contact layer 422 connects to the vertical NAND string at the bottom of the memory hole. In some embodiments, the floating gate material 410 may be replaced with a charge storage material or a charge trapping layer (e.g., silicon nitride). Therefore, the vertical NAND structure depicted in FIG. 4A may be implemented using either floating-gate transistors or charge-trap transistors.

Figure 4B:
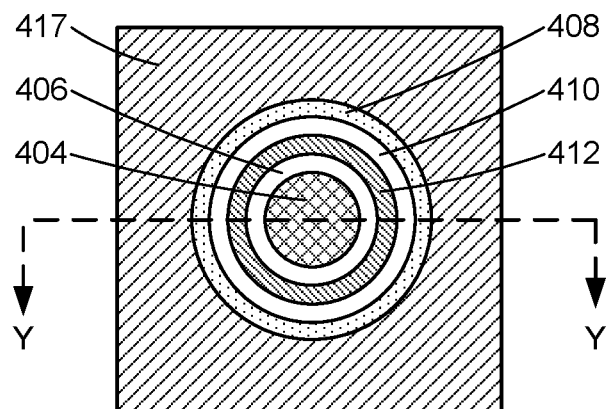
FIG. 4B depicts one embodiment of a cross-sectional view taken along line X-X of FIG. 4A.

FIG. 4B depicts one embodiment of a cross-sectional view taken along line X-X of FIG. 4A. As depicted, the vertical NAND string includes an inner core material layer 404 that is surrounded by the channel layer material 406 that is surrounded by the tunneling layer material 412 that is surrounded by the floating gate material 410 that is surrounded by the dielectric material 408 that is surrounded by the control gate material layer 417. In one embodiment, FIG. 4A may depict a cross-sectional view taken along line Y-Y of FIG. 4B. In one embodiment, the vertical NAND string may be formed using a vertical cylindrical structure or a vertical tapered cylindrical structure. In this case, the dielectric material 408, floating gate material 410, tunneling layer material 412, and channel layer material 406 of the vertical NAND string may comprise vertical annular structures surrounding the core material layer 404. In another embodiment, the vertical NAND string may be formed using a vertical pillar structure or a vertical rectangular prism structure.

Figure 4C:
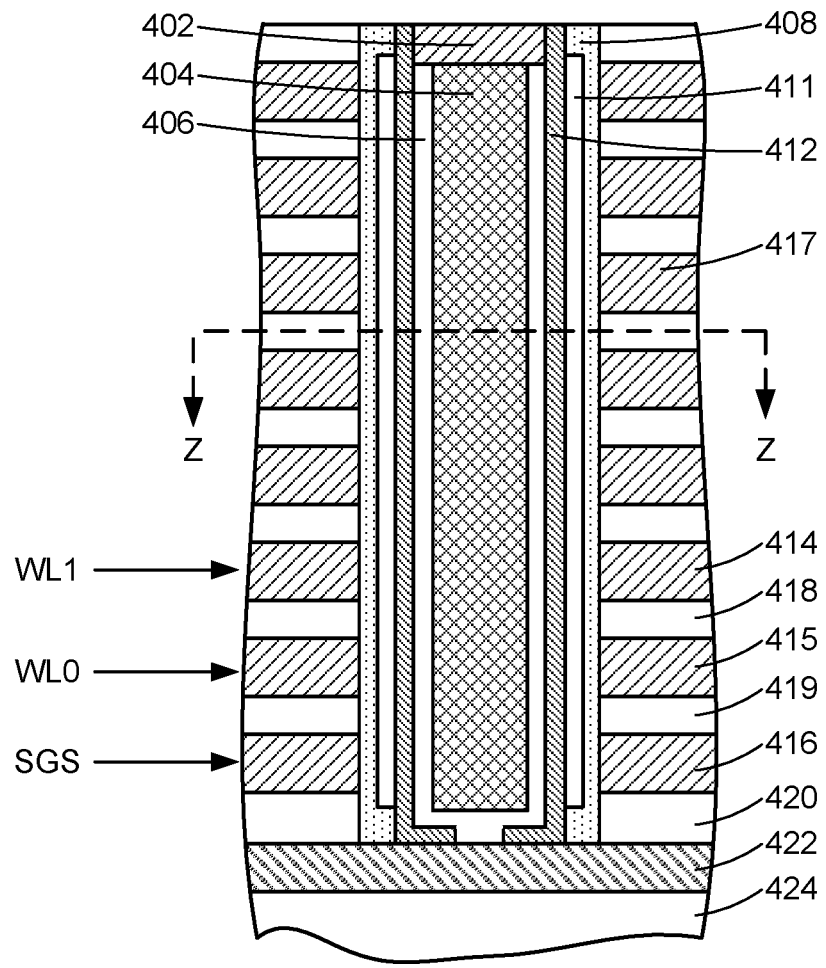
FIG. 4C depicts another embodiment of a vertical NAND structure.

FIG. 4C depicts another embodiment of a vertical NAND structure. The vertical NAND structure of FIG. 4C is similar to that depicted in FIG. 4A except that the floating gate material 410 has been replaced with a charge trap material 411 (e.g., silicon nitride). The vertical NAND string is formed above the substrate 424 and oriented such that the vertical NAND string is orthogonal to the substrate 424. The vertical NAND string may be arranged within a vertical memory hole that is etched through alternating layers of word line material (e.g., tungsten or polysilicon) and an insulator material (e.g., oxide or silicon oxide).

Figure 4D:
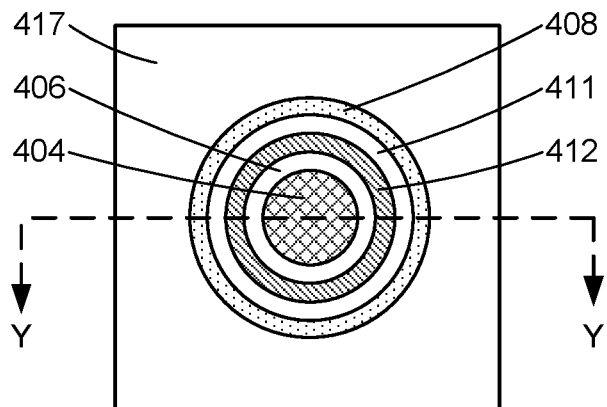
FIG. 4D depicts one embodiment of a cross-sectional view taken along line Z-Z of FIG. 4C.

FIG. 4D depicts one embodiment of a cross-sectional view taken along line Z-Z. As depicted, the vertical NAND string includes an inner core material layer 404 that is surrounded by the channel layer material 406 that is surrounded by the tunneling layer material 412 that is surrounded by the charge trap material 411 that is surrounded by the dielectric material 408 that is surrounded by the insulator material 418 (e.g., silicon dioxide). In one embodiment, FIG. 4C may depict a cross-sectional view taken along line Y-Y of FIG. 4D. In one embodiment, the vertical NAND string may be formed using a vertical cylindrical structure or a vertical tapered cylindrical structure. In this case, the dielectric material 408, charge trap material 411, tunneling layer material 412, and channel layer material 406 of the vertical NAND string may comprise vertical annular structures surrounding the core material layer 404. In another embodiment, the vertical NAND string may be formed using a vertical pillar structure or a vertical rectangular prism structure.

Figure 5:
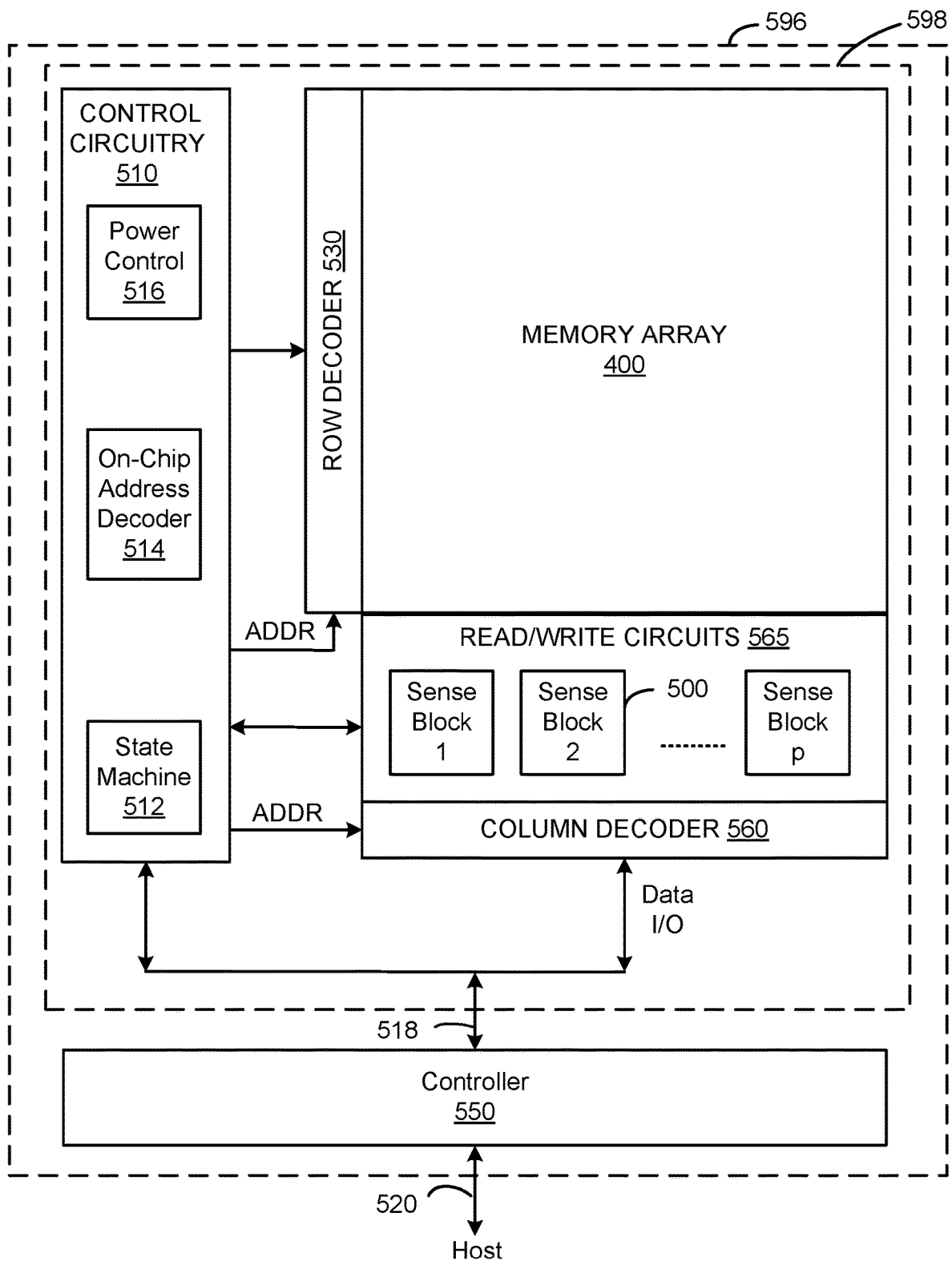
FIG. 5 depicts one embodiment of a non-volatile storage system including read/write circuits for reading and programming a page

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that may generate voltages greater than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits or the one or more control circuits may perform or facilitate one or more memory array operations including erasing, programming, or reading operations.

The sense blocks 500 or the read/write circuits 565 may comprise sensing circuits. The sense blocks 500, read/write circuits 565, and/or other sensing circuitry arranged on the memory die 598 may comprise representative examples of means for setting a set of bit lines (e.g., one or more bit lines) connected to a set of memory cells to a first bit line voltage based on a set of sensing conditions associated with a source line voltage zone. A source line voltage zone may refer to a grouping of NAND strings that have the same, or a substantially similar, set of sensing conditions applied during a sensing operation, such as a read operation. In one embodiment, NAND strings within a source line voltage zone comprise a subset of NAND strings of the NAND strings forming a memory cell array and members of the subset share a common physical attribute. For example, the common physical attribute may be a position of a NAND string relative to other structures that form, or support, the memory cell array. In another example, the common physical attribute may be a substantially similar electrical resistance relative to other NAND strings of the memory cell array. In another embodiment, NAND strings within a particular source line voltage zone comprise a subset of NAND strings of the NAND strings forming a memory cell array and members of the subset are neighbors are interdigitated with other NAND strings that are not in the particular source line voltage zone.

The sense blocks 500, read/write circuits 565, and/or other sensing circuitry arranged on the memory die 598 may comprise representative examples of means for concurrently reading a first set of data from a first set of memory cells while a first set of sensing conditions are applied to the first set of memory cells and reading a second set of data from a second set of memory cells while a second set of sensing conditions are applied to the second set of memory cells. The first set of sensing conditions may include application of a first bit line voltage to bit lines connected to the first set of memory cells and/or application of a first sensing time for sensing the first set of memory cells to determine data states stored using the first set of memory cells. State machines, such as state machine 512, and control circuitry, such as control circuitry 510, may comprise representative examples of means for identifying or determining a first plurality of source line voltage zones for a first plurality of memory cells and/or a second plurality of source line voltage zones for a second plurality of memory cells. The first plurality of memory cells may be connected to a first word line and the second plurality of memory cells may be connected to a second word line.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
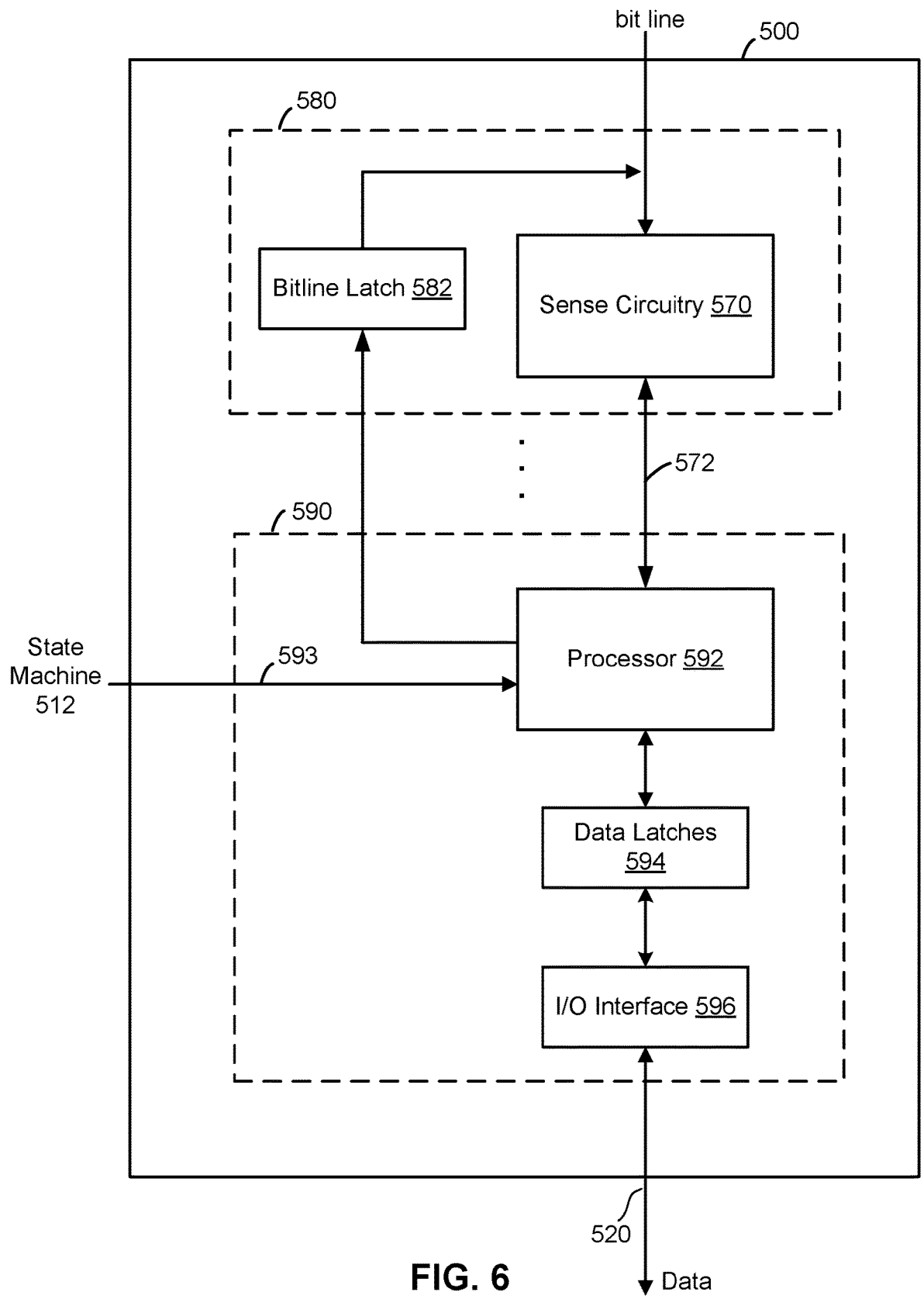
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 7A:
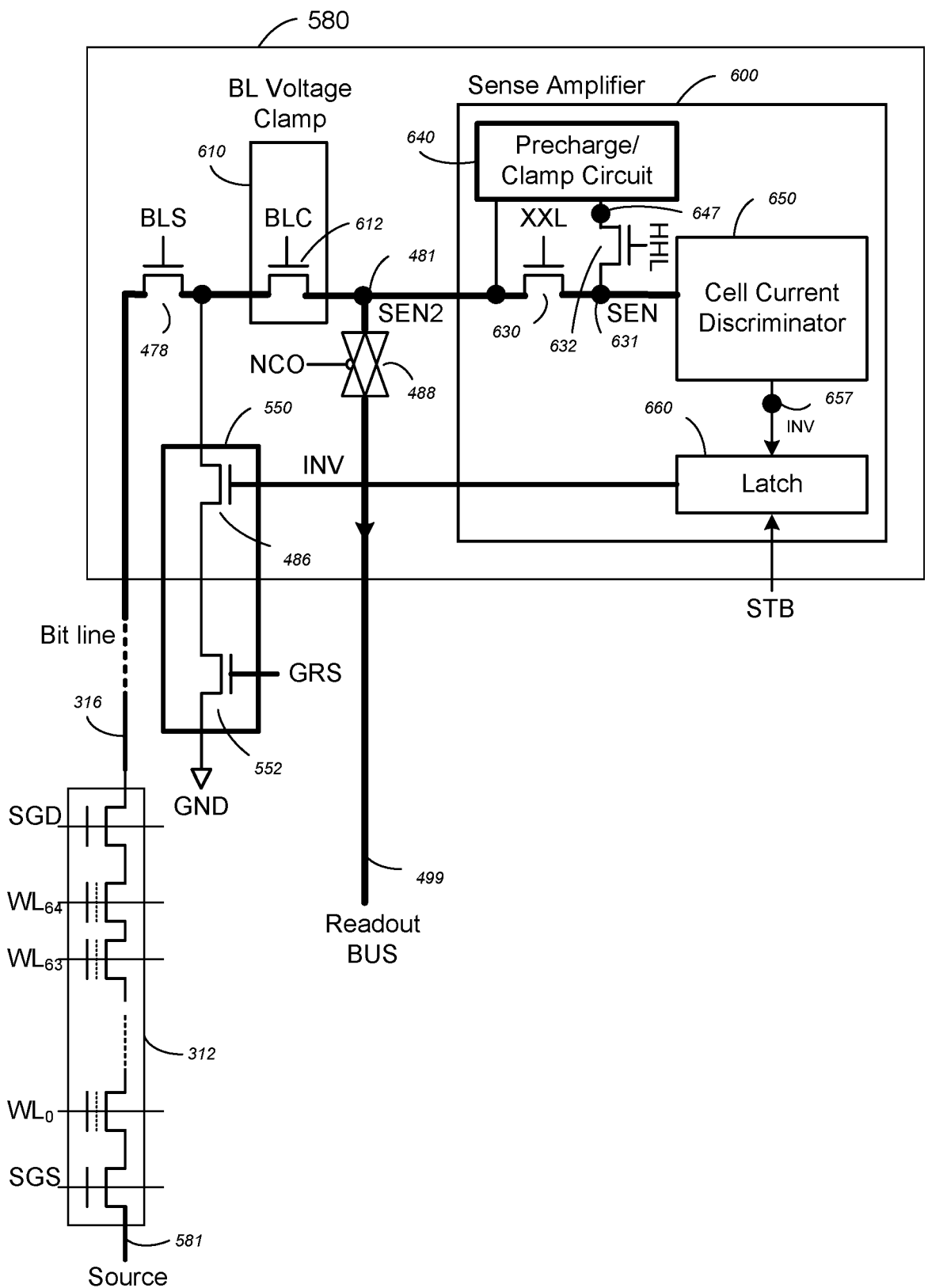
FIG. 7A depicts one embodiment of a sense module.

FIG. 7A depicts one embodiment of a sense module, such as sense module 580 in FIG. 6. As depicted, the sense module may sense the conduction current of a memory cell in a NAND string 312 via a coupled bit line 316. Sense module 580 has a sense node 481 that can be selectively coupled to a bit line, a sense amplifier 600, and a readout bus 499. An isolation transistor 478, when enabled by a signal BLS, connects the bit line 316 to the sense node 481. The sense amplifier 600 senses the sense node 481. Sense amplifier 600 includes a pre-charge/clamp circuit 640, a cell current discriminator 650, and a latch 660. One embodiment of a pre-charge/clamp circuit 640 is described later in reference to FIG. 7B. One embodiment of a cell current discriminator 650 is described later in reference to FIG. 7C.

In one embodiment, sense module 580 controls the voltages and limiting currents applied to bit line 316 and senses the conduction current of a selected memory cell in the NAND string 312. The sense module 580 may include a pull-down circuit 550, which includes transistors 486 and 552, for selectively pulling the bit line 316 to ground. The pull-down circuit 550 is activated when both the signal INV and another signal GRS are both HIGH. The sense module 580 may include a bit line voltage clamp 610, which may clamp the bit line voltage during sensing. Bit line voltage clamp 610 may operate as a source-follower with transistor 612 in series with the bit line 316. BLC may be set to roughly a threshold voltage above the desired bit line voltage (e.g., 0.5V or 0.7V) during sensing. The source 581 of the NAND string 312 may be set to 0V or another bias voltage (e.g., 100 mV) during sensing of the conduction current of the selected memory cell.

Figure 7B:
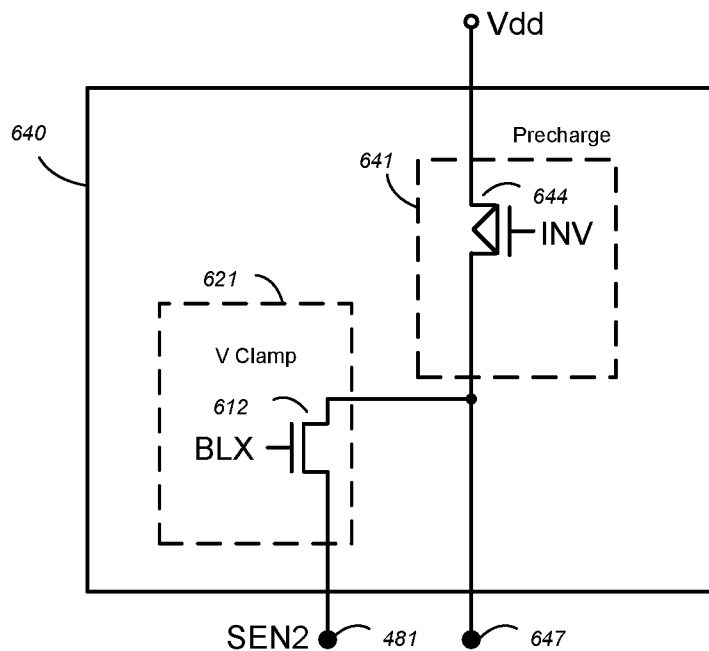
FIG. 7B depicts one embodiment of a pre-charge/clamp circuit.

FIG. 7B depicts one embodiment of a pre-charge/clamp circuit, such as pre-charge/clamp circuit 640 in FIG. 7A. The pre-charge/clamp circuit has a voltage clamp 621 component and a pre-charge circuit 641 component. The voltage clamp 621 is implemented by a transistor 612 controlled by an analog signal BLX at its gate. BLX is such that it ensures sufficient voltage on the node SEN2 481 (see FIG. 7A) so that the bit line voltage clamp 610 can function properly. The pre-charge circuit 641 is implemented by transistor 644 controlled by the signal INV at its gate.

Referring to FIG. 7A, when the selected gate voltage (e.g., a predetermined threshold voltage level) applied to a selected word line is stable, then the conduction current or the programmed threshold voltage of the selected memory cell can be sensed via the coupled bit line 316 via the transistor 630 gated by a signal XXL.

Figure 7C:
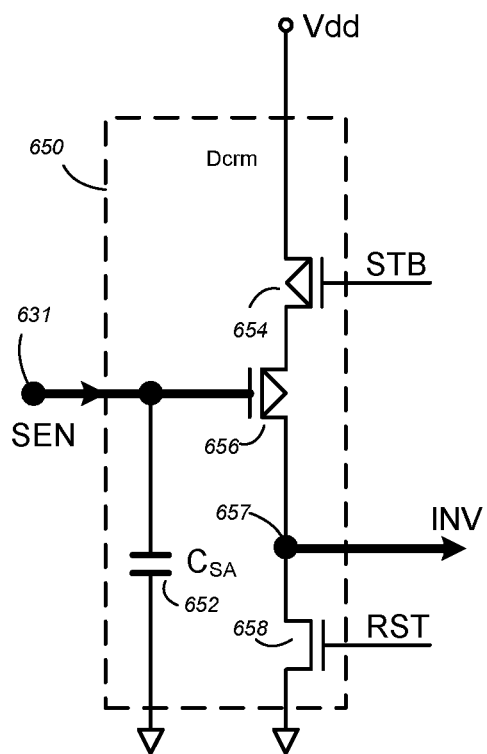
FIG. 7C depicts one embodiment of a cell current discriminator circuit.

FIG. 7C depicts one embodiment of a cell current discriminator circuit, such as cell current discriminator circuit 650 in FIG. 7A. The cell current discriminator 650 serves as a discriminator or comparator of current levels. It is coupled to the sense node to sense the conduction current in the memory cell. Cell current discriminator 650 includes a capacitor 652, p-channel transistor 656, transistors 654 and transistor 658. The cell current discriminator indirectly measures the conduction current of a memory cell by the rate it charges or discharges the capacitor 652. This is accomplished by sensing the signal SEN at the node 631. The signal SEN controls the gate of the p-transistor 656. Prior to sensing, SEN is pre-charged to VDD (HIGH) by the pre-charge circuit 641. Referring to FIG. 7A, the pre-charge is enabled by a signal HHL turning on the coupling transistor 632 so that the node SEN 631 is coupled to the pre-charge circuit 641 at node 647. Sensing is then accomplished by measuring the memory cell's conduction current by the rate it discharges the capacitor 652.

In one embodiment, during sensing, the conduction current of the selected memory cell will discharge the capacitor 652. The voltage of the node SEN will then decrease from VDD at a rate depending on the conduction current. After a predetermined discharging period (or sensing time), SEN will drop to some value that may or may not turn on the measuring p-transistor 656. If it drops sufficiently low to turn on the p-transistor 656, it will mean that the conduction current is higher than the reference current. This will also result in the INV signal being pulled HIGH when the signal STB is asserted. On the other hand, if the transistor 656 is not turned on at the end of the sensing period, the conduction current is lower than the reference current and the signal INV will be LOW. Referring to FIG. 7A, the end of the sensing period is marked by decoupling the bit line from the SEN node with XXL turning off the coupling transistor 630. The sensed result is then latched into the latch 660 based on a strobe signal STB. After the sensed result has been latched, signal NCO may be used to pass the state of the sense node 481 to the readout bus 499 via transfer gate 488.

In another embodiment, a cell current discriminator circuit may include a current mirror, which mirrors the current through the bit line, and a comparator which compares the mirrored current with a reference current. In some cases, a target reference current (or target cell current) may be injected into the bit line in order to facilitate current sensing. In some cases, the cell current discriminator circuit may include a differential amplifier for comparing the voltage associated with a sensed result with a reference voltage and determining the state of a memory cell based on the comparison.

Figure 8A:
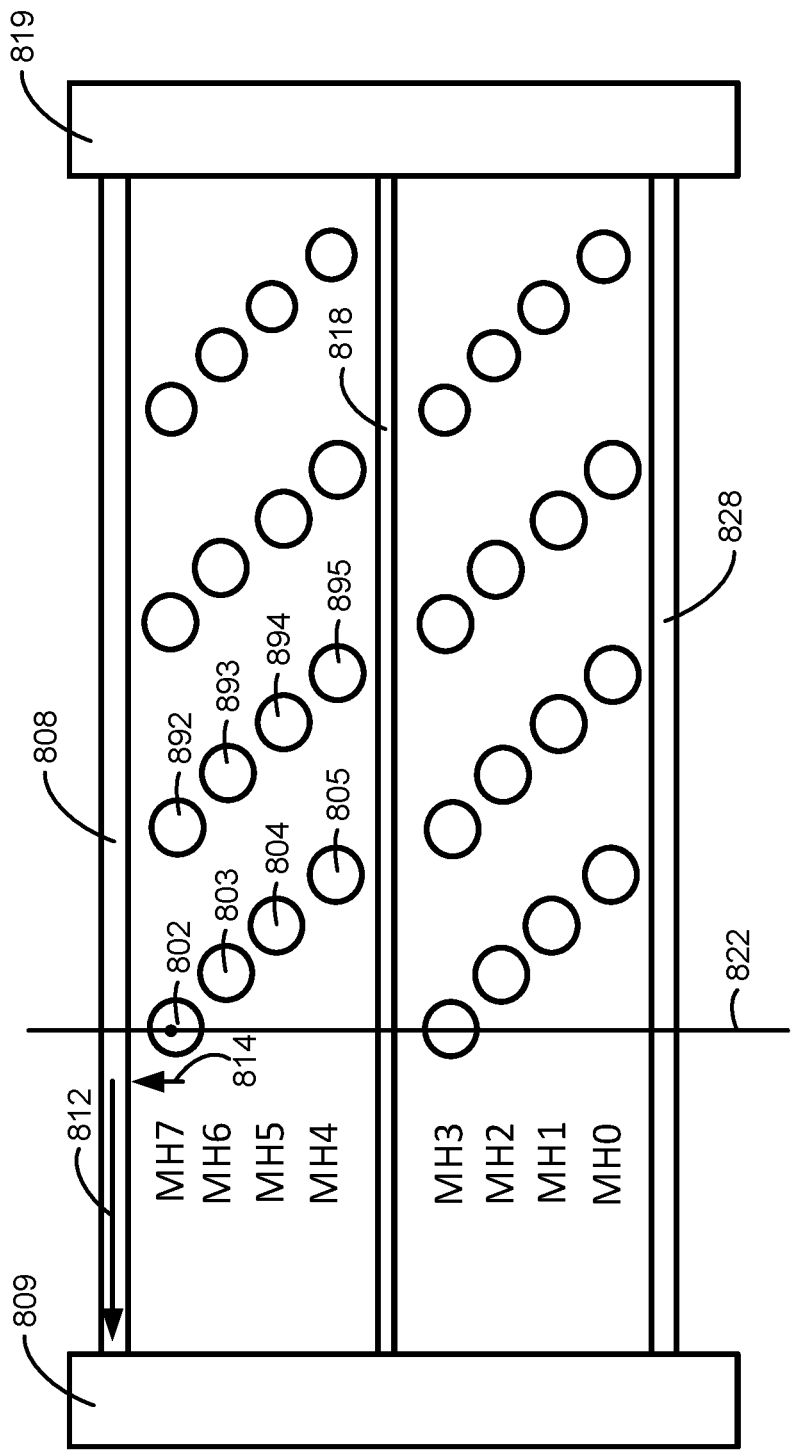
FIG. 8A depicts one embodiment of a top plan view of a portion of a memory array.

FIG. 8A depicts one embodiment of a top plan view of a portion of a memory array. The memory array includes a plurality of NAND strings associated with vertical memory hole strings, such as memory hole strings 802-805, that extend into the page. The memory hole strings may comprise vertical NAND strings that are arranged orthogonal to a substrate of a memory die. Each of the vertical NAND strings may include a plurality of memory cell transistors, such as floating-gate transistors or charge-trap transistors. In one example, each of the memory hole strings may include 64 floating-gate transistors and select gates at the ends of the NAND string. Memory hole MH7 may correspond with memory hole string 802, memory hole MH6 may correspond with memory hole string 803, memory hole MH5 may correspond with memory hole string 804, and memory hole MH4 may correspond with memory hole string 805. The source-side ends of the NAND strings may connect to a source line grid via a well connection, such as a portion of the well connection 814. The well connection may correspond with an N-well sheet, such as the source line layer 422 in FIG. 4A when the source line layer 422 comprises an N-well layer, that is arranged underneath the memory hole strings and abuts the source-side ends of each of the memory hole strings within the portion of the memory array.

The layout of the memory array may also include vertical shunts, such as vertical shunt 809 and vertical shunt 819, and horizontal shunts, such as horizontal shunts 808, 818, and 828. The shunts 808, 809 are horizontal and vertical in the top plan view of FIG. 8A, in a 3D memory array of one embodiment, the shunts each rise vertically above a substrate, when viewed from the side. The vertical shunts 809 and 819 and the horizontal shunts 808, 818, and 828 may form part of the source line grid (e.g., the distributed grid for distributing the source line voltage to the source-side end of the NAND strings). The vertical shunt 809 may comprise a vertical tungsten sheet of a first width and the horizontal shunt 808 may comprise a horizontal sheet of a second width less than the first width. The vertical and horizontal shunts may extend into the page and have similar depth as the memory hole strings.

For the memory hole string 802, the source line resistance path is through the portion of the well connection 814 to the horizontal shunt 808 and then through a portion 812 of the horizontal shunt 808 to the vertical shunt 809. In some cases, the source line resistance path may be dominated by the distance of a memory hole string from the closest horizontal shunt, such as horizontal shunt 808 or horizontal shunt 818.

In this case, outer memory hole strings, such as memory hole strings 802 and 805 may have a lower source line resistance compared with inner memory hole strings, such as memory hole strings 803 and 804. Thus, the memory cells of the inner memory hole strings may be assigned to a first zone (e.g., associated with a higher source line resistance) and the outer memory hole strings may be assigned to a second zone (e.g., associated with a smaller source line resistance). A bit line 822 (e.g., an aluminum wire arranged above the memory hole strings) may connect to the bit line side of the memory hole string 802 at a top end of the NAND string. A first word line (not depicted) may connect to memory cells in memory hole strings 802 and 892 and a second word line (not depicted) may connect to memory cells in memory hole strings 803 and 893.

In other cases, the source line resistance path may be dominated by the distance of a memory hole string to the closest vertical shunt. In this case, the memory hole strings 802-805 may be assigned to a side zone and the memory hole strings 892-895 may be assigned to a middle zone. During a read operation, the bit line voltage (e.g., 200 mV) applied to the bit lines connected to memory hole strings 802-805 may be less than the bit line voltage (e.g., 400 mV) applied to the bit lines connected to the memory hole strings 892-895. Furthermore, the sensing time (e.g., 400 ns) for the memory cells of the memory hole strings 802-805 may be less than the sensing time (e.g., 600 ns) for the memory cells of the memory hole strings 892-895. Although a longer sensing time or a higher bit line voltage applied during sensing of the memory cells may increase the overall power and/or read time of the memory cells, the trade-off is a reduction in number of bit errors.

Figure 8B:
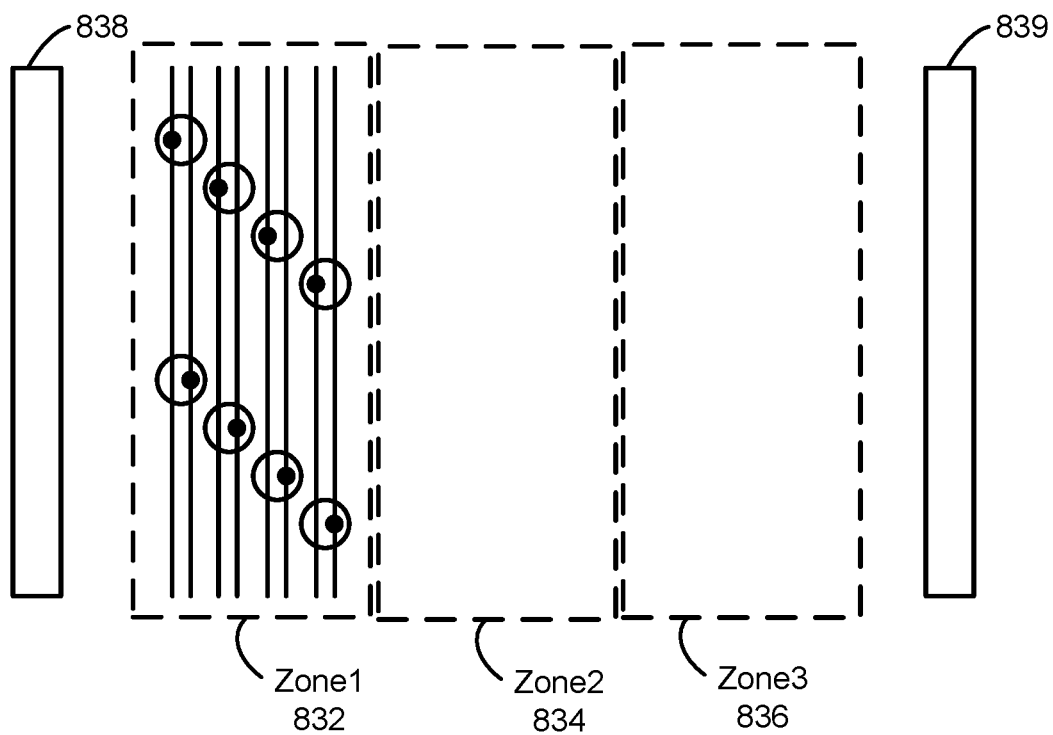
FIG. 8B depicts one embodiment of a top plan view of a portion of a memory array.

FIG. 8B depicts one embodiment of a top plan view of a portion of a memory array. The memory array includes a first set of memory hole strings (or vertical NAND strings) corresponding with a first source line voltage zone Zone1 832, a second set of memory hole strings corresponding with a second source line voltage zone Zone2 834, and a third set of memory hole strings corresponding with a third source line voltage zone 836. The three source line voltage zones 832, 834, and 836 may be arranged between two vertical shunts 838 and 839, which may comprise a low-resistance portion of the source line grid for connecting to the source-side ends of the NAND strings. The source line grid may be driven via a source line driver that biases or sets the source line voltage for the memory array during a read operation.

Figure 8C:
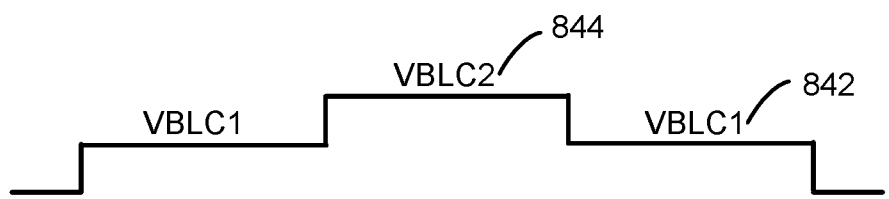
FIG. 8C depicts one embodiment of source line voltage levels applied to memory cells within different source line voltage zones.

FIG. 8C depicts one embodiment of source line voltage levels applied to memory cells of different source line voltage zones (832, 834, 836). During a read operation, a first bit line voltage VBLC1 842 (e.g., 200 mV) may be applied to bit lines connected to the memory hole strings of zones 832 and 836, while a second bit line voltage VBLC2 844 (e.g., 400 mV) may be applied to bit lines connected to the memory hole strings of zone 834. The source line voltage zones 832 and 836 may comprise side zones and the source line voltage zone 834 may comprise a middle zone. In some cases, upon detection that a bit error count has exceeded a threshold bit error count (e.g., more than two bit errors have occurred), the voltage applied to the bit lines connected to the memory hole strings of zone 834 may be increased (e.g., by 100 mV) until the bit error count no longer exceeds the threshold bit error count.

Figure 8D:
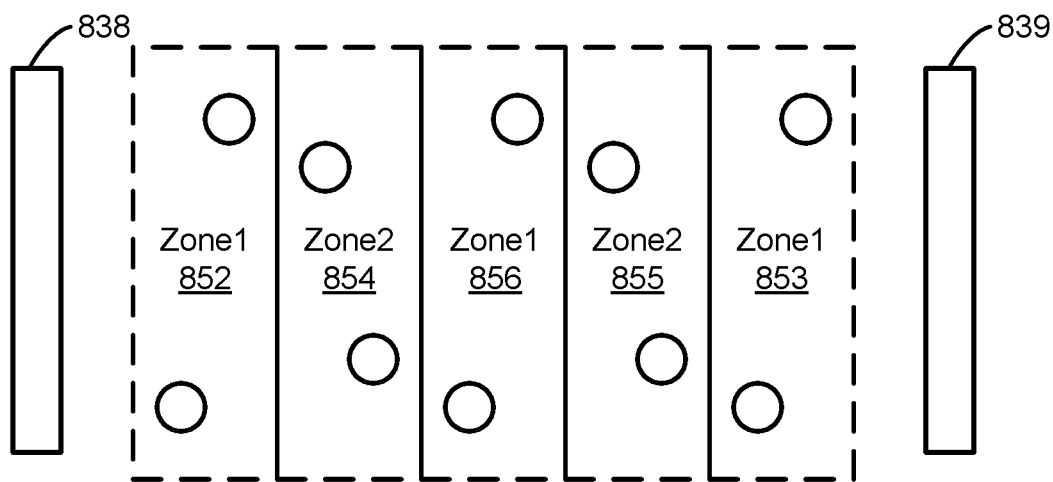
FIG. 8D depicts one embodiment of a top plan view of a portion of a memory array.

FIG. 8D depicts one embodiment of a top plan view of a portion of a memory array in which memory hole strings have been arranged between source line vertical shunts 838-839. The memory array includes memory hole strings assigned to two different zones (Zone1 and Zone2). The memory hole strings within zones 852, 856, and 853 have been assigned to zone Zone1 (e.g., a zone with a lower maximum source line resistance) and the memory hole strings within zones 854 and 855 have been assigned to zone Zone2 (e.g., a zone with a higher maximum source line resistance). In one embodiment, the memory hole strings associated with zone Zone1 may comprise outer memory hole strings and the memory hole strings associated with zone Zone2 may comprise inner memory hole strings. The inner memory hole strings may be farther from horizontal shunts (not depicted), such as horizontal shunt 808 in FIG. 8A, than the outer memory hole strings. As the source line resistance may be higher for the inner memory hole strings than the outer memory hole strings, the bit line voltages and/or the sensing times for the memory cells of the inner memory hole strings may be increased relative to those used for the memory cells of the outer memory hole strings.

Figure 9A:
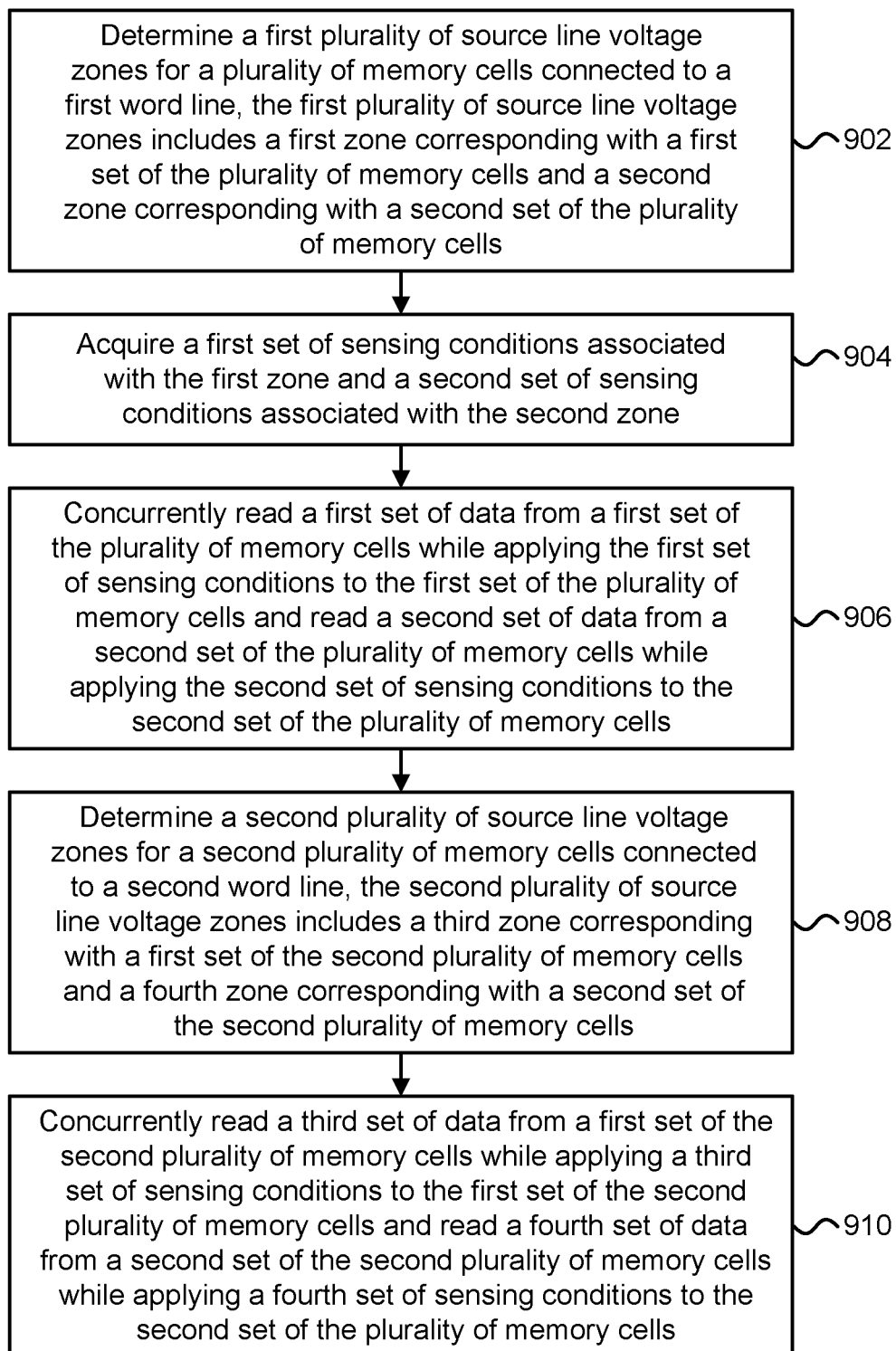
FIG. 9A is a flowchart describing one embodiment of a process for performing a read operation.

FIG. 9A is a flowchart describing one embodiment of a process for performing a read operation. In one embodiment, the process of FIG. 9A may be performed by a non-volatile storage system, such as non-volatile storage system 596 in FIG. 5.

In step 902, a first plurality of source line voltage zones for a plurality of memory cells connected to a first word line is determined. The first plurality of source line voltage zones may include a first zone corresponding with a first set of the plurality of memory cells and a second zone corresponding with a second set of the plurality of memory cells. The plurality of memory cells may correspond with memory cells for storing a page of data. In one example, the first zone may correspond with zone Zone1 832 in FIG. 8B and the second zone may correspond with zone Zone2 834 in FIG. 8B. In another example, the first zone may correspond with memory hole strings 802-805 in FIG. 8A and the second zone may correspond with memory hole strings 892-895 in FIG. 8A.

In step 904, a first set of sensing conditions associated with the first zone and a second set of sensing conditions associated with the second zone are acquired. The sensing conditions may be acquired from a look-up table stored in non-volatile memory. In one embodiment, the data defining the sensing conditions that is stored in the look-up table may be determined during the design and/or manufacture of the non-volatile memory. In another embodiment, the data defining the sensing conditions that is stored in the look-up table may be dynamically determined by a memory controller during operation or power up of a memory device that includes the non-volatile memory. The sensing conditions may include bit line bias conditions (e.g., the selected bit line voltages), sensing times (e.g., how long the sensing pulse for a sense amplifier is applied), and/or sensing current loads (e.g., whether an additional sensing current is added during sensing of the memory cells). The first zone may be identified via a first range of bit line addresses (e.g., corresponding with bit lines BL0-BL100) and the second zone may be identified via a second range of bit line addresses (e.g., BL101-200).

In step 906, a first set of data is read from a first set of the plurality of memory cells while applying the first set of sensing conditions to the first set of the plurality of memory cells concurrent with reading a second set of data from a second set of the plurality of memory cells while applying the second set of sensing conditions to the second set of the plurality of memory cells. In this case, both the first set of data and the second set of data are read from the plurality of memory cells while applying two different sets of sensing conditions to the memory cells based on the source line voltage zone assigned to the memory cells. In one example, memory cells of the first zone may be biased to a first bit line voltage and memory cells of the second zone may be biased to a second bit line voltage greater than the first bit line voltage. In another example, memory cells within the first zone may be sensed using a first sensing time and memory cells within the second zone may be sensed using a second sensing time greater than the first sensing time. In some cases, during the concurrent read operation, the first word line may be biased to a selected word line voltage, the first set of the plurality of memory cells may be read using a first bit line voltage and a first sensing time, and the second set of the plurality of memory cells may be read using a second bit line voltage greater than the first bit line voltage and a second sensing time greater than the first sensing time.

In step 908, a second plurality of source line voltage zones for a second plurality of memory cells connected to a second word line is determined. The second plurality of source line voltage zones includes a third zone corresponding with a first set of the second plurality of memory cells and a fourth zone corresponding with a second set of the second plurality of memory cells. The first word line (e.g., WL1) and the second word line (e.g., WL2) may comprise adjacent word lines within a memory array. In step 910, a third set of data is read from a first set of the second plurality of memory cells while applying a third set of sensing conditions to the first set of the second plurality of memory cells concurrent with reading a fourth set of data from a second set of the second plurality of memory cells while applying a fourth set of sensing conditions to the second set of the second plurality of memory cells. In this case, both the third set of data and the fourth set of data may be read from the second plurality of memory cells at the same time while applying two different sets of sensing conditions to the memory cells based on the source line voltage zone assigned to the memory cells.

In one embodiment, the number of source line voltage zones for the first plurality of source line voltage zones may comprise a first number and the number of source line voltage zones for the second plurality of source line voltage zones may comprise a second number greater than the first number. In one example, the first plurality of source line voltage zones may comprise one zone and the second plurality of source line voltage zones may comprise three zones. In another example, the first plurality of source line voltage zones may comprise two zones and the second plurality of source line voltage zones may comprise three zones. The number of source line voltage zones for the second plurality of memory cells may have been increased due to the number of bit errors discovered when reading data stored within the second plurality of memory cells during a prior read operation. The number of source line voltage zones may be increased until the number of bit errors no longer exceeded a threshold number of bit errors.

Figure 9B:
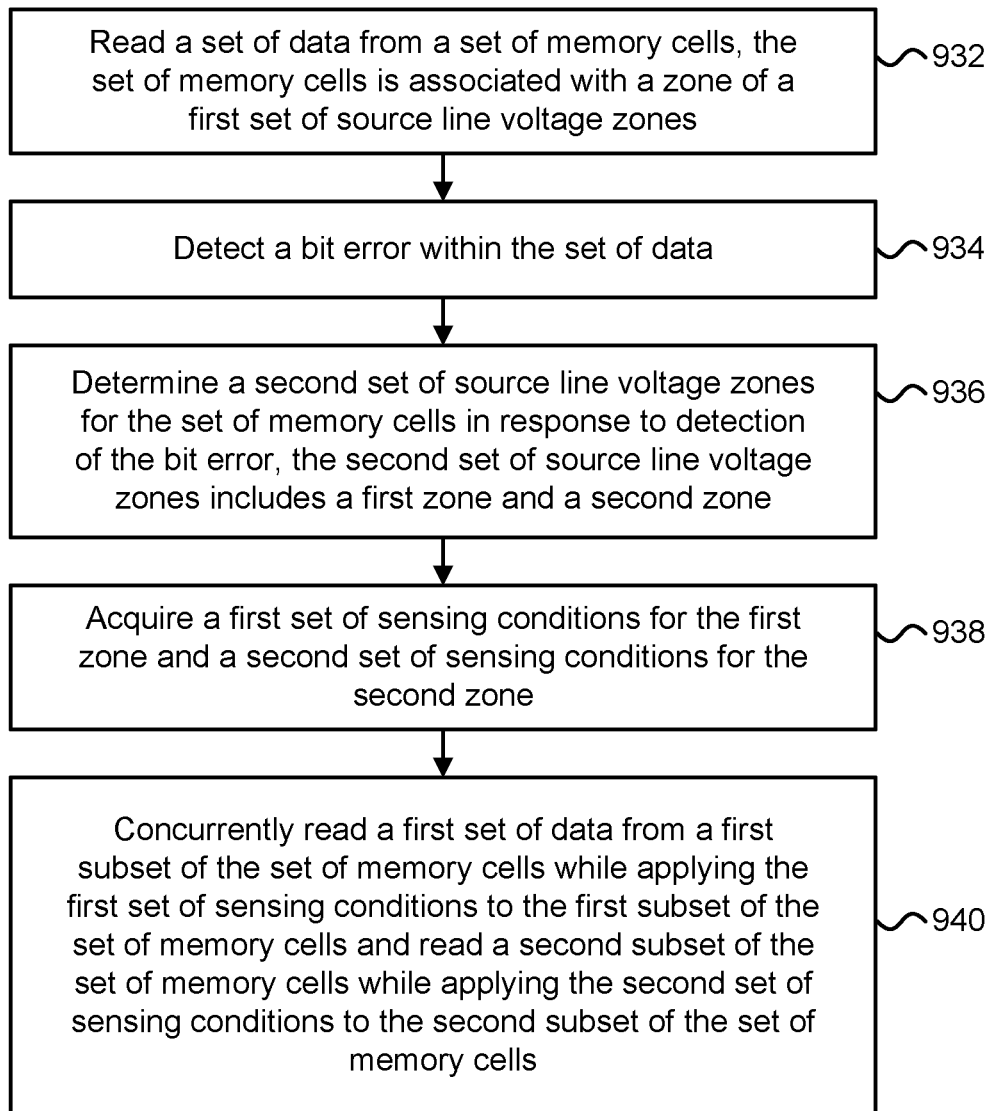
FIG. 9B is a flowchart describing another embodiment of a process for performing a read operation.

FIG. 9B is a flowchart describing another embodiment of a process for performing a read operation. In one embodiment, the process of FIG. 9B may be performed by a non-volatile storage system, such as non-volatile storage system 596 in FIG. 5.

In step 932, a set of data is read from a set of memory cells. The set of memory cells may correspond with floating-gate transistors or charge-trap transistors. The set of memory cells may be associated with a zone of a first set of source line voltage zones. The first set of source line voltage zones may comprise one or more zones. In step 934, a bit error is detected within the set of data. The bit error may be detected using error detection and/or error-code correction (ECC) circuitry, such as ECC circuitry arranged within the controller 550 in FIG. 5 or within the control circuitry 510 in FIG. 5.

In step 936, a second set of source line voltage zones for the set of memory cells is determined in response to detection of the bit error. The second set of source line voltage zones includes a first zone and a second zone. In one embodiment, the number of source line voltage zones may be increased by one or two zones in response to detection of the bit error. In one example, the first set of source line voltage zones may comprise one zone and the second set of source line voltage zones may comprise three zones. The first zone may correspond with a side zone, such as zone Zone1 832 in FIG. 8B, and the second zone may correspond with a middle zone, such as zone Zone2 834 in FIG. 8B.

In step 938, a first set of sensing conditions for the first zone and a second set of sensing conditions for the second zone are acquired. The sensing conditions may be acquired from a lookup table or from a non-volatile memory in which the sensing conditions are stored or specified. In step 940, a first set of data is read from a first subset of the set of memory cells while applying the first set of sensing conditions to the first subset of the set of memory cells concurrent with reading a second subset of the set of memory cells while applying the second set of sensing conditions to the second subset of the set of memory cells.

In some embodiments, the number of source line voltage zones corresponding with different ranges of source line resistances may be dynamically adjusted over time depending on the number of bit errors encountered. In one example, if the number of bit errors is greater than a threshold number of bit errors for data stored using the set of memory cells, then the number of source line voltage zones for the set of memory cells may be increased (e.g., one or two zones may be added). In another example, if the number of bit errors is less than a threshold number of bit errors for data stored using the set of memory cells, then the number of source line voltage zones for the set of memory cells may be decreased (e.g., two or more zones may be consolidated). The updated sensing conditions and/or bit line address mappings for the different source line voltage zones may be written to a look-up table or a non-volatile memory.

In some embodiments, prior to reading a first page of data from a first set of memory cells, the number of source line voltage zones for the first set of memory cells may be determined (e.g., acquired from a look-up table) and the first page of data may be read by applying different sensing conditions to memory cells of the different source line voltage zones. Therefore, the number of source line voltage zones may vary per page with some pages using a first number of zones (e.g., three zones) and other pages using a second number of zones different from the first number of zones (e.g., five zones).

In some embodiments, the number of source line voltage zones may be increased if a chip temperature is above a threshold temperature. In one example, if a chip temperature is above the threshold temperature during a read operation, then the number of source line voltage zones used for reading data may be increased (e.g., from three zones to five zones).

In some embodiments, groupings of NAND strings within a memory array may be determined based on the temperatures of the NAND strings within the memory array. Multiple temperature sensors may be arranged around the memory array in order to determine the temperatures of the different groupings of NAND strings. The different groupings of NAND strings may be concurrently read using different sensing conditions.

One embodiment of the disclosed technology includes a sensing circuit and a plurality of memory cells configured into a first source line voltage zone and a second source line voltage zone. The first source line voltage zone associated with a first set of sensing conditions and the second source line voltage zone associated with a second set of sensing conditions different from the first set of sensing conditions. The sensing circuit configured to concurrently read a first set of data from a first set of the plurality of memory cells while applying the first set of sensing conditions to the first set and read a second set of data from a second set of the plurality of memory cells while applying the second set of sensing conditions to the second set.

One embodiment of the disclosed technology includes a plurality of memory cells, a zone selection circuit, and a sensing circuit. The zone selection circuit configured to determine a first set of sensing conditions associated with a first zone of a plurality of source line voltage zones for the plurality of memory cells and a second set of sensing conditions associated with a second zone of the plurality of source line voltage zones for the plurality of memory cells. The sensing circuit configured to concurrently read a first set of data from a first set of the plurality of memory cells while applying the first set of sensing conditions to the first set of the plurality of memory cells and read a second set of data from a second set of the plurality of memory cells while applying the second set of sensing conditions to the second set of the plurality of memory cells.

One embodiment of the disclosed technology includes determining a first plurality of source line voltage zones for a first plurality of memory cells connected to a first word line. The first plurality of source line voltage zones includes a first zone and a second zone. The method further comprises acquiring a first set of sensing conditions associated with the first zone and a second set of sensing conditions associated with the second zone and concurrently reading a first set of data from a first set of the first plurality of memory cells while applying the first set of sensing conditions to the first set of the first plurality of memory cells and reading a second set of data from a second set of the first plurality of memory cells while applying the second set of sensing conditions to the second set of the first plurality of memory cells. The method further comprises determining a second plurality of source line voltage zones for a second plurality of memory cells connected to a second word line different from the first word line. The second plurality of source line voltage zones includes a third zone and a fourth zone. The method further comprises acquiring a third set of sensing conditions associated with the third zone and a fourth set of sensing conditions associated with the fourth zone and concurrently reading a third set of data from a first set of the second plurality of memory cells while applying the third set of sensing conditions to the first set of the second plurality of memory cells and reading a fourth set of data from a second set of the second plurality of memory cells while applying the fourth set of sensing conditions to the second set of the second plurality of memory cells.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
   a plurality of memory cells configured into a first source line voltage zone and a second source line voltage zone, each memory cell within the first source line voltage zone is positioned less than a threshold distance away from a shunt of a source line grid and corresponds with a source line resistance less than a threshold source line resistance, each memory cell within the second source line voltage zone is positioned greater than the threshold distance away from the shunt of the source line grid and corresponds with a source line resistance greater than the threshold source line resistance, the first source line voltage zone associated with a first set of sensing conditions and the second source line voltage zone associated with a second set of sensing conditions different from the first set of sensing conditions; and
   a sensing circuit configured to concurrently read a first set of data from a first set of the plurality of memory cells while applying the first set of sensing conditions to the first set and read a second set of data from a second set of the plurality of memory cells while applying the second set of sensing conditions to the second set.

2. The apparatus of claim 1, wherein:
   the first zone corresponds with a first set of bit lines connected to the first set of the plurality of memory cells, the first set of bit lines comprises one or more bit lines; and
   the second zone corresponds with a second set of bit lines connected to the second set of the plurality of memory cells, the first set of the plurality of memory cells corresponds with a first set of vertical NAND strings positioned less than the threshold distance away from a horizontal shunt of the source line grid and the second set of the plurality of memory cells corresponds with a second set of vertical NAND strings positioned greater

23 than the threshold distance away from the horizontal shunt of the source line grid.

3. The apparatus of claim 1, wherein:
the first zone corresponds with a first set of bit line addresses associated with inner memory hole NAND strings; and
the second zone corresponds with a second set of bit line addresses associated with outer memory hole NAND strings.

4. The apparatus of claim 1, wherein:
the first source line voltage zone and the second source line voltage zone are predetermined.

5. The apparatus of claim 1, wherein:
the first set of sensing conditions comprises application of a first bit line voltage to a first set of bit lines connected to the first set of the first plurality of memory cells; and
the second set of sensing conditions comprises application of a second bit line voltage different from the first bit line voltage to a second set of bit lines connected to the second set of the first plurality of memory cells.

6. The apparatus of claim 1, wherein:
the first set of sensing conditions comprises application of a first sensing time to read the first set of data; and
the second set of sensing conditions comprises application of a second sensing time different from the first sensing time to read the second set of data, the first sensing time is less than the second sensing time.

7. The apparatus of claim 1, further comprising:
a zone selection circuit configured to determine the first set of sensing conditions associated with the first source line voltage zone and the second set of sensing conditions associated with the second source line voltage zone, the plurality of memory cells connect to a first word line and a second plurality of memory cells connect to a second word line, the zone selection circuit configured to determine a third set of sensing conditions associated with a third zone of a second plurality of source line voltage zones and a fourth set of sensing conditions associated with a fourth zone of the second plurality of source line voltage zones, the sensing circuit is configured to concurrently read a third set of data from a first set of the second plurality of memory cells while applying the third set of sensing conditions to the first set of the second plurality of memory cells and read a fourth set of data from a second set of the second plurality of memory cells while applying the fourth set of sensing conditions to the second set of the second plurality of memory cells.

8. The apparatus of claim 7, wherein:
the third zone corresponds with a third range of bit line addresses and the first zone corresponds with a first range of bit line addresses that is smaller than the third range of bit line addresses.

9. The apparatus of claim 7, wherein:
the first set of the first plurality of memory cells comprises a first number of memory cells and the first set of the second plurality of memory cells comprises a second number of memory cells greater than the first number of memory cells.

10. The apparatus of claim 7, wherein:
the first plurality of source line voltage zones comprises a first number of zones and the second plurality of source line voltage zones comprises a second number of zones greater than the first number of zones.

24

11. An apparatus, comprising:
a controller; and
a memory die including a plurality of NAND strings and a read circuit,
the read circuit configured to determine a first NAND string associated with a first range of source line resistances and a second NAND string associated with a second range of source line resistances,
the read circuit configured to read data from the first NAND string using a first set of sensing conditions and read a data from the second NAND string using a second set of sensing conditions.

12. A method, comprising:
determining a first plurality of source line voltage zones for a first plurality of memory cells connected to a first word line, the first plurality of source line voltage zones includes a first zone and a second zone;
acquiring a first set of sensing conditions associated with the first zone and a second set of sensing conditions associated with the second zone;
concurrently reading a first set of data from a first set of the first plurality of memory cells while applying the first set of sensing conditions to the first set of the first plurality of memory cells and reading a second set of data from a second set of the first plurality of memory cells while applying the second set of sensing conditions to the second set of the first plurality of memory cells;
determining a second plurality of source line voltage zones for a second plurality of memory cells connected to a second word line different from the first word line, the second plurality of source line voltage zones includes a third zone and a fourth zone;
acquiring a third set of sensing conditions associated with the third zone and a fourth set of sensing conditions associated with the fourth zone; and
concurrently reading a third set of data from a first set of the second plurality of memory cells while applying the third set of sensing conditions to the first set of the second plurality of memory cells and reading a fourth set of data from a second set of the second plurality of memory cells while applying the fourth set of sensing conditions to the second set of the second plurality of memory cells.

13. The method of claim 12, wherein:
the first zone corresponds with a first set of bit lines connected to the first set of the first plurality of memory cells; and
the second zone corresponds with a second set of bit lines connected to the second set of the first plurality of memory cells, the first set of bit lines is at least partially interdigitated with the second set of bit lines.

14. The method of claim 12, wherein:
the first plurality of memory cells comprises one of a set of floating-gate transistors or a set of charge trap transistors;
the first zone corresponds with a first set of bit line addresses associated with inner memory hole NAND strings; and
the second zone corresponds with a second set of bit line addresses associated with outer memory hole NAND strings.

15. The method of claim 12, wherein:
the concurrently reading includes concurrently reading the first set of data using a first sensing time while reading the second set of data using a second sensing time greater than the first sensing time.

16. The method of claim 12, further comprising:
setting a first set of bit lines connected to the first set of the first plurality of memory cells to a first bit line voltage based on the first set of sensing conditions;
setting a second set of bit lines connected to the second set of the first plurality of memory cells to a second bit line voltage different from the first bit line voltage based on the second set of sensing conditions;
concurrently reading the first set of data from the first set of the first plurality of memory cells while applying the first bit line voltage to the first set of bit lines and reading the second set of data from the second set of the first plurality of memory cells while applying the second bit line voltage to the second set of bit lines;
setting a third set of bit lines connected to the first set of the second plurality of memory cells to a third bit line voltage based on the third set of sensing conditions;
setting a fourth set of bit lines connected to the second set of the second plurality of memory cells to a fourth bit line voltage different from the third bit line voltage based on the fourth set of sensing conditions; and
concurrently reading the third set of data from the first set of the second plurality of memory cells while a third bit line voltage is applied to the third set of bit lines and reading the fourth set of data from the second set of the second plurality of memory cells while a fourth bit line voltage is applied to the fourth set of bit lines.

17. The method of claim 16, wherein:
the third zone corresponds with a third range of bit line addresses and the first zone corresponds with a first range of bit line addresses that is greater than the third range of bit line addresses.

18. The method of claim 16, wherein:
the first set of the first plurality of memory cells comprises a first number of memory cells and the first set of the second plurality of memory cells comprises a second number of memory cells greater than the first number of memory cells.

19. The method of claim 16, wherein:
the first plurality of source line voltage zones comprises a first number of zones and the second plurality of source line voltage zones comprises a second number of zones greater than the first number of zones.

20. An apparatus, comprising:
a set of memory cells;
a sensing circuit configured to read a set of data from the set of memory cells, the set of memory cells is associated with a zone of a first set of source line voltage zones, the first set of source line voltage zones comprises a first number of source line voltage zones; and
a control circuit configured to detect a bit error within the set of data and identify a second set of source line voltage zones for the set of memory cells in response to detection of the bit error within the set of data, the second set of source line voltage zones comprises a second number of source line voltage zones greater than the first number of source line voltage zones, the second set of source line voltage zones includes a first zone and a second zone, the control circuit configured to acquire a first set of sensing conditions associated with the first zone and a second set of sensing conditions associated with the second zone, the sensing circuit configured to concurrently read a first set of data from a first subset of the set of memory cells while the first set of sensing conditions is applied to the first subset and read a second set of data from a second subset of the set of memory cells while the second set of sensing conditions is applied to the second subset.

21. The apparatus of claim 20, wherein:
the set of memory cells comprises one of a set of floating-gate transistors or a set of charge trap transistors;
the first zone corresponds with a first set of memory cells associated with inner memory hole strings; and
the second zone corresponds with a second set of memory cells associated with outer memory hole strings.

22. The apparatus of claim 20, wherein:
the first zone corresponds with a first set of bit lines connected to the first subset of the set of memory cells; and
the second zone corresponds with a second set of bit lines connected to the second subset of the set of memory cells, the first set of bit lines is at least partially interdigitated with the second set of bit lines.

23. The apparatus of claim 22, wherein:
the first set of sensing conditions comprises application of a first bit line voltage to the first set of bit lines; and
the second set of sensing conditions comprises application of a second bit line voltage different from the first bit line voltage to the second set of bit lines.

24. The apparatus of claim 20, wherein:
the first set of sensing conditions comprises application of a first sensing time to read the first set of data; and
the second set of sensing conditions comprises application of a second sensing time greater than the first sensing time to read the second set of data.

25. An apparatus, comprising:
means for identifying a first plurality of source line voltage zones for a first plurality of memory cells, the first plurality of source line voltage zones includes a first zone and a second zone;
means for setting a first set of bit lines connected to a first set of the first plurality of memory cells to a first bit line voltage based on a first set of sensing conditions associated with the first zone;
means for setting a second set of bit lines connected to a second set of the first plurality of memory cells to a second bit line voltage different from the first bit line voltage based on a second set of sensing conditions associated with the second zone, the first set of bit lines is at least partially interdigitated with the second set of bit lines; and
means concurrently reading a first set of data from the first set of the first plurality of memory cells while the first bit line voltage is applied to the first set of bit lines and reading a second set of data from the second set of the first plurality of memory cells while the second bit line voltage is applied to the second set of bit lines.

* * * * *